United States Patent
Forlenza et al.

[11] Patent Number: 5,930,270
[45] Date of Patent: Jul. 27, 1999

[54] LOGIC BUILT IN SELF-TEST DIAGNOSTIC METHOD

[75] Inventors: Donato O. Forlenza; Franco Motika, both of Hopewell Junction, N.Y.; John J. Shushereba, Essex Junction; Phillip J. Nigh, Williston, both of Vt.

[73] Assignee: International Business Machines Corporation, Armonk, N.Y.

[21] Appl. No.: 08/898,942

[22] Filed: Jul. 23, 1997

[51] Int. Cl.$^6$ ............................ G01R 31/28; G06F 11/00
[52] U.S. Cl. ........................... 371/25.1; 371/22.4
[58] Field of Search .................. 371/25.1, 22.4, 371/67.1, 71; 324/76.78

[56] References Cited

U.S. PATENT DOCUMENTS 4,763,274  8/1988  Junker et al. .................. 324/76.78

*Primary Examiner*—Hoa T. Nguyen
*Attorney, Agent, or Firm*—Schmeiser, Olsen & Watts; Richard M. Kotulak

[57] ABSTRACT

A system and method for diagnosing the faults of an electronic device by running a series of tests, identifying the tests where the electronic device failed, without having to check the results of each test, storing information generated during only the tests where the electronic device failed, and using the information to diagnose the faults in the electronic device. The test results are accumulated into a Multiple Input Shift Register (MISR) which need not be examined after each test to determine which tests the device failed. The problem of a failure during one test manifesting into the MISR during subsequent tests is handled by predicting the effect of the failure on the MISR during subsequent tests.

26 Claims, 7 Drawing Sheets

| CYCLE SIGNATURE | DEFECT FREE | DEFECTIVE | ERROR SIG. |
|---|---|---|---|
| 0 | 0000 0000 0000 0000 | 0000 0000 0000 0000 | |
| i<br>PREV. SIG.<br>OUTPUT<br>FEEDBACK<br>NEW SIG. | 0000 0000 0000 0000<br>0011 0011 0011 1110<br>1000 1000 0000 0010<br>0001 1001 1001 1111 | 0000 0000 0000 0000<br>0011 0011 0011 1110<br>1000 1000 0000 0010<br>0001 1001 1001 1111 | 0000 0000 0000 0000 |
| i+1<br>PREV. SIG.<br>OUTPUT<br>FEEDBACK<br>NEW SIG. | 0001 1001 1001 1111<br>1010 1010 1010 1010<br>1000 1000 0000 0010<br>1001 1101 1001 1011 | 0001 1001 1001 1111<br>1010 1010 1010 1010<br>1000 1000 0000 0010<br>1001 1101 1001 1011 | 0000 0000 0000 0000 |
| i+2<br>PREV. SIG.<br>OUTPUT<br>FEEDBACK<br>NEW SIG. | 1001 1101 1001 1011<br>1111 0000 0000 1111<br>1001 1101 1001 1011<br>1111 0010 1100 1011 | 1001 1101 1001 1011<br>1111 0000 0010 1101<br>1001 1101 1001 1011<br>1111 0010 1101 1010 | 0000 0000 0001 0001 |
| i+3<br>PREV. SIG.<br>OUTPUT<br>FEEDBACK | 1111 0010 1100 1011<br>1111 1111 1111 1111<br>1000 1000 0000 0010 | 1111 0010 1101 1010<br>1111 1111 1111 1111<br>0000 0000 0000 0000 | 0000 0000 0001 0001<br>1100 0100 0000 1001 |

*FIG. 4*

LOGIC BUILT IN SELF-TEST DIAGNOSTIC METHOD

TECHNICAL FIELD OF THE INVENTION

The present invention is related to test systems and methods and, more particularly, test systems and methods for testing an electronic device, such as an integrated circuit (IC).

BACKGROUND OF THE INVENTION

Because an electronic device, such as an integrated circuit, will most lively contain many inputs and outputs and latches, an exhaustive test is unfeasible. Exhaustive testing of even a single latch would require not only coverage of all possible inputs and outputs but also coverage of all possible sequences of inputs.

In attempting to solve this problem, cumulative tests have been developed which succeed in achieving extremely high coverage (typically identifying 99.9% of defective devices). In a typical cumulative test, a pattern of signals is inputted to the device and the outputs of various gates and latches are examined. A set of compressed outputs are collectively known as a signature. The signature will invariably be a compressed representation of the outputs of all the gates and latches on the device. Furthermore, a defect in a latch may only manifest itself as an output error after a number of successive cycles. Consequently, the existence of a defective latch or gate could easily fail to affect the resulting signature. However, application of a proper sequence of input patterns will cause most possible defects to eventually manifest in the signature.

Comparing the signature after each input pattern is applied would significantly slow down the test. However, by introducing feedback into the register containing the signature, only the last signature needs to be checked. After the input pattern is applied to the device, the outputs of the device and the contents of the register (which is the signature that resulted from the application of the previous input pattern) are input to an Exclusive-OR circuit (XOR). At the next clock signal, the outputs of the XOR-circuit are loaded into the shift register. Additionally, the shift register contains a number of feedback bits. In this manner, the signature contained in the register is not only cumulative of the outputs for the current input pattern, but is cumulative of the outputs for all of the input patterns that have been applied previously. Therefore, when a defect in a latch or gate results in an error in the signature, this error will continue to propagate into every subsequent signature until the test is completed. Consequently, in order to perform pass or fail testing of the device, only the last signature needs to be compared to the predetermined valid signature of a defect-free device. It will be appreciated that some errors will be masked during compression of the output responses to form the signature.

This method of testing is highly effective in pass or fail testing. But when the cause of the defect or failure needs to be determined, the test encounters severe diagnostic problems. To aid the diagnostic process, the input patterns are manipulated in a manner that a defect can be deduced based on the information contained in the signatures that are in error. However, a defect might cause more than one signature to be in error. Additionally, the device might have more than one defect.

A problem arises in determining the signatures that contain information that are useful in resolving the error. Reviewing each signature would successfully find the first signature that was in error. However, because of the use of feedback, every subsequent signature would also be in error. Although a subsequent signature is in error, the error could be the mere result of an earlier error propagating itself due to feedback in the register and not the result of an incorrect output. Therefore, although in error, the signature contains information that is redundant as far as determining the location of the failure.

One approach is to subdivide the test into a set of smaller intervals. At the end of each interval, the register is compared to a predetermined output, and then reset. This way an output that is in error would be confined to its interval. At the completion of the test, the intervals containing errors are noted. These intervals are then retested and all of the signatures that are in error are recorded. While this may reduce the number of signatures that are recorded, the number of recorded signatures is still proportional to the length of the interval and the amount of data that is collected can quickly become too large.

The use of feedback in the register containing the signature greatly reduces the response data volume and increases the speed of the test by propagating an error in any signature to every subsequent signature. This same quality is what contributes to the difficulty in collecting the signatures which contain useful information about the fault(s) in the device. What is desired is a way to record only the signatures with errors that resulted from failures in the device and not errors which are mere propagations of previous signatures that were in error.

SUMMARY OF THE INVENTION

The aforementioned goal may be achieved in accordance with the principles of the present invention.

Accordingly, the invention is directed towards a method for diagnosing faults in a device by applying a sequence of test inputs to the device, collecting actual signatures corresponding to the sequence of test inputs, dividing the actual signatures into one or more intervals, finding a failing interval from the intervals, finding a failing signature in the failing interval, and deriving an expected signature from the failing signature.

The invention is also directed to a system for diagnosing failures in a device comprising means for applying a sequence of test inputs to the device, means for collecting actual signatures corresponding to the sequence of test inputs, means for dividing the actual signatures into one or more intervals, means for finding a failing interval from the intervals, means for finding a failing signature in the failing interval, and means for deriving an expected signature from the failing signature.

The invention is also directed to an information handling system and computer readable medium for diagnosing failures in a device by implementing the method and system described above.

Other features and advantages of the present invention will become apparent in the following detailed description of the preferred embodiment of the invention taken in conjunction with the accompanying drawings.

BRIEF DESCRIPTION OF THE DRAWINGS

FIG. 4 is an exemplary illustration of expected signature extrapolation according to the present invention.

DETAILED DESCRIPTION OF A PREFERRED EMBODIMENT OF THE INVENTION

The preferred embodiment of the invention utilizes a Linear Feedback Shift Register (LFSR). The contents of the LFSR serve as the inputs (test vector or test inputs) and are applied to an electronic device to be tested. The LFSR acts like a pseudo-random pattern generator such that at every clock pulse, the LFSR will contain a new test vector. The preferred embodiment also uses a Multiple Input Shift Register (MISR) to capture and compress the outputs of the device.

Figure 1:
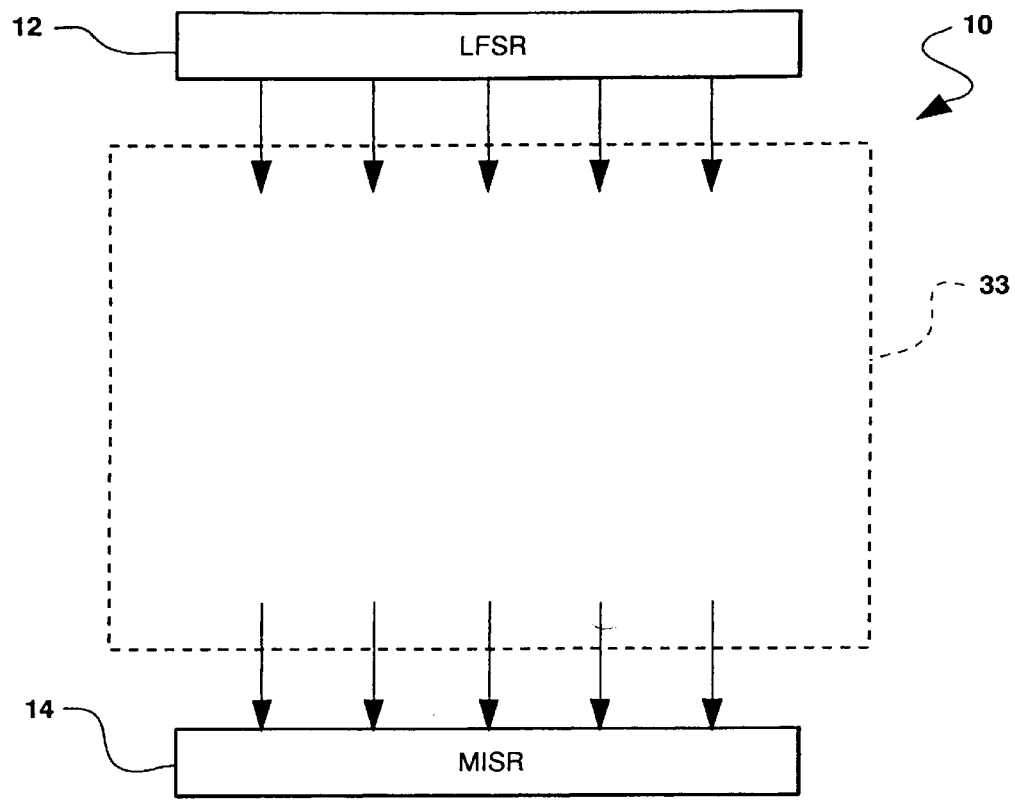
FIG. 1 is a diagram of an LFSR providing inputs to an electronic device and a MISR collecting the outputs of the device.

Referring now to FIG. 1, a system 10 which utilizes a LFSR and a MISR will be illustrated. A LFSR 12 applies test vectors to an electronic device 33 to be tested. After each clock cycle, a different test vector is applied to device 33. The outputs of device 33 are input to MISR 14.

Figure 2:
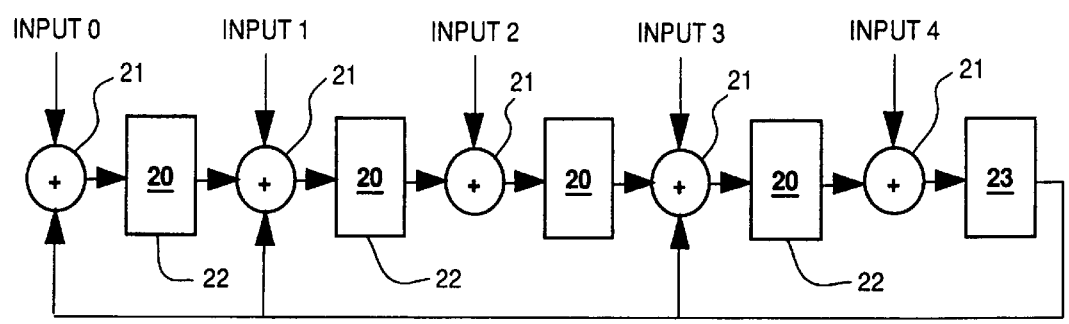
FIG. 2 is a diagram of a MISR utilized in a system according to the present invention.

Referring now to FIG. 2, MISR 14 of FIG. 1 is shown in greater detail. The MISR comprises a chain of latches 20, each separated by a modulo-2 adder 21. The inputs to the modulo-2 adders 21 are the outputs of the latches 20, the device outputs (shown as Input 0–Input 4) and in some cases, the output of the last latch in the chain 23. The latches 22 immediately after the modulo-2 adders which input the output of the last latch in the chain 23 are feedback bits. It will be appreciated that the MISR configuration shown in FIG. 2 is provided as an example and that any number of latches may be utilized as well as different configurations. For example, instead of providing feedback to each adder input in a standard configuration, a modular configuration which provides feedback from each latch to the first latch may be utilized.

The MISR is linear in that where $F_i(x)$ is the ith content of the MISR, and where $F_j(y)$ is the content of the MISR at the jth clock pulse:

$$F_{i+j}(x+y)=F_i(x)+F_j(y);$$

Figure 3:
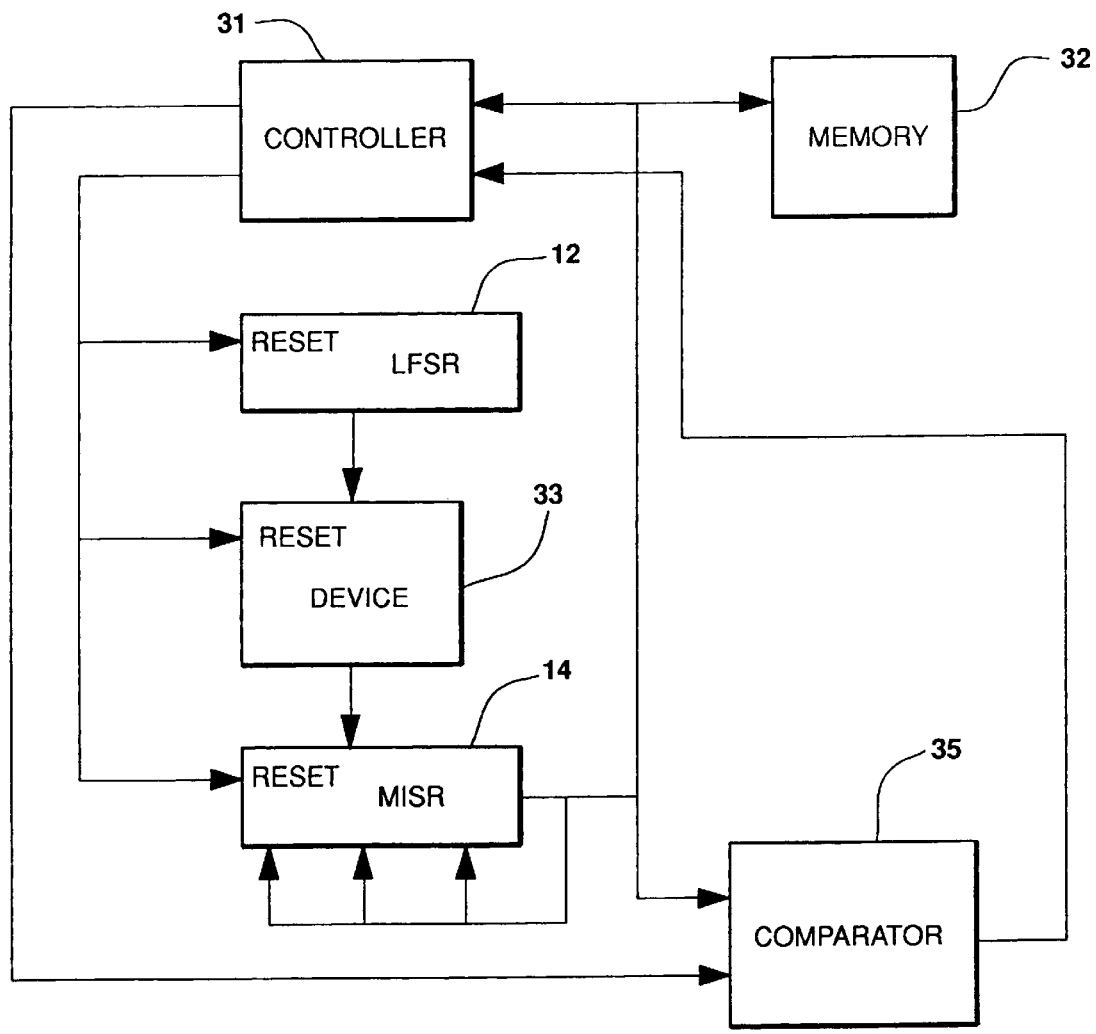
FIG. 3 is a block diagram of a system according to the present invention.

Referring now to FIG. 3, a system utilizing the LFSR 12 and MISR 14 to test the device 33 will be illustrated. Reference numerals utilized in FIGS. 1 and 2 which are similar or identical to reference numerals utilized in FIG. 3 indicate like, similar, or identical components. LFSR 12, MISR 14, and device 33 are reset by a controller 31. After the reset, LFSR 12 applies test vectors for device 33 being tested. LFSR 12 can either be on-chip with device 33 or external to it. The outputs of device 33 are collected into MISR 14 (signature). During the performance of the test, controller 31 simulates the operation of LFSR 12 and derives the pattern of test vectors that is being used to test device 33. Controller 31 also simulates or retrieves the operation of device 33 and for each test vector, simulates the outputs of device 33 and the contents of MISR 14. The simulated output of MISR 14, the Good Machine Signature, is presumed to be the correct signature of device 33. MISR 14 is compared to the Good Machine Signature generated by controller 31.

When controller 31 simulates or retrieves the operation of MISR 14, it subdivides the signatures into a set of intervals. At the end of each interval, MISR 14 is compared to the Good Machine Signature (GMS) derived by controller 31. MISR 14 and the GMS are compared by comparator 35. At the and of the interval, controller 31 sends the GMS to comparator 35. After sending the GMS, controller 31 examines the output of comparator 35. If the GMS and MISR 14 are equal, then the interval has passed.

If MISR 14 and the GMS disagree, a failure has occurred during the interval, and the interval must be retested. While there are a number of ways that this can be performed, in the preferred embodiment, Controller 31 makes a note of the failing interval, and the test is continued to the next interval. To prevent a failing signature during one interval from corrupting the signature of another interval, MISR 14 is reset at the end of each interval by controller 31. When the last interval in the pattern (at some point, the pattern produced by LFSR 12 will begin to repeat itself) is completed, the first pass of the test is completed. At this point, controller 31 has noted all of the failing intervals. If there are no failing intervals, device 33 is defect free.

If after completing the test, controller 31 has noted any failing intervals, device 33 has fault(s) and the test is repeated a second time. The first test, known as go/nogo testing, determines whether device 33 has fault(s). The second test (the "diagnostic test") determines the cause and location of the fault. Controller 31 resets MISR 14 and initializes device 33 and LFSR 12. The test is run the same as the first time, except during the intervals where device 33 is known to have failed (failing intervals). LFSR 12 generates the same test vectors and controller 31 subdivides the signatures into the same intervals.

During the failing intervals, instead of only checking comparator 35 at the completion of the interval, controller 31 checks comparator 35 after every clock cycle. By starting from the first signature in the failing interval and comparing MISR 14 with the GMS at every cycle, controller 31 identifies the first failing signature. The data generated by device 33 is stored into memory 32 for analysis. Because of the feedback characteristic of MISR 14, every subsequent signature will also be in error, regardless of whether the outputs of device 33 contain an error. In order to ascertain whether the signature of the next cycle is erroneous due to an error in the outputs of device 33, controller 31 extrapolates an expected signature which represents what MISR 14 would contain, given the GMS and MISR 14 for the current cycle, and the GMS for the next cycle The expected signature represents what will appear on MISR 14 during the next cycle, if device 33 does not fail, given the current contents of MISR 14. During the next cycle, controller 31 sends an expected signature (EMS) to comparator 35.

After the comparison, controller 31 extrapolates the expected signature for the following cycle. This process is repeated for each remaining test vector in the failing interval. Whenever comparator 35 indicates that MISR 14 and the expected signature are different, a failure has occurred in device 33. Controller 31 stores the data generated by device 33 when comparator 35 indicates this.

The process by which controller 31 extrapolates the expected signature is known as Linear Signature Superpositioning. An example of this is illustrated in FIG. 4 with a 16-bit MISR with feedback to bits 0, 4, and 14. The row entitled "Output" represents the output of a defect-free device and the actual outputs (under the "Defect Free" and "Defective" columns, respectively). The row entitled "New Sig." represents the GMS and the actual value that is in the MISR (under the "Defect Free" and "Defective" columns, respectively). These two values are compared by comparator 35. The row entitled "Prev. Sig." represents the GMS and the contents of the MISR 14 before the outputs of the device are applied to the MISR during the cycle.

In FIG. 4, the interval is commenced at cycle i and is completed after cycle i+the length of the signature interval. Note that during cycle i, "Prev. Sig." is the reset value. After the outputs of the device are applied to the MISR 14, the contents of the MISR 14 and the GMS are compared by the comparator 35. After cycle i, the GMS and the MISR agree so the comparator 35 will generate a match signal, which means that the test cycle passed. This process is repeated for cycle i+1.

Note that after cycle i+2, the new signatures of the "Defect Free" and "Defective" columns are different for the first time. When the comparator 35 compares these values, it will generate a mismatch signal to the controller 31. In order to determine the expected signature for the next cycle (i+3), the error signature is determined for cycle i+2 by the comparator 35 and sent to the controller 31 (in the "Error Sig." column for the cycle i+2). The error signature is the GMS—(modulo-2) MISR. Because the MISR 14 is linear, the signature that would result from error-free outputs given the error is the register function of the MISR added modulo-2 to the GMS. The register function of the error signature yields the error signature of the following cycle, given proper outputs of device 33. Therefore, if the outputs of the device are proper, the actual signatures should equal the good machine signature modulo-2 plus the new error signature $$F(Defective) = F(Defect\text{-}Free) + F(Error\ Sig.)$$

$$F(1111\ 0010\ 1100\ 1011) = F(1111\ 0010\ 1101\ 1010) + F(0000\ 0000\ 0001\ 0001)$$

$$F(Defective) + Outputs = [F(Defect\text{-}Free) + F(Error\ Sig.)] + Outputs$$

$$F(1111\ 0010\ 1100\ 1011) + F(1111\ 1111\ 1111\ 1111) =$$
$$F(1111\ 0010\ 1101\ 1010) +$$
$$F(0000\ 0000\ 0001\ 0001) + F(1111\ 1111\ 1111\ 1111)$$

By definition, $$Expected\ Signature = F(Defective) + Outputs$$

$$Expected\ Signature = [F(Defect\text{-}Free) + Outputs] + F(Error\ Sig.)$$

By definition, $GMS = F(Defect\text{-}Free) + Outputs$ $$Expected\ Signature = GMS + F(error)$$
$$= 1100\ 0010\ 1001\ 1011 +$$
$$1100\ 0100\ 0000\ 1001$$

$$Expected\ Signature = 0000\ 0110\ 1001\ 0010$$

For each subsequent cycle, the controller 31 predicts the error signature (F(Error Sig.)) by taking the error signature (Error Sig.) of the current cycle and simulating the shift function of the MISR 14. Controller 31 then simulates the GMS of device 33 for the next cycle. The controller determines the expected signature by modulo-2 adding F(Error Sig.) to the GMS for the next cycle.

During subsequent cycles in the failing interval, the MISR 14 is compared to the Expected Signature, instead of the GMS. Where there are further discrepancies, the signature in MISR 14 contains useful information in diagnosing the cause of the failure and is recorded into memory 32. The modulo-2 difference between the expected signature and the MISR 14 is determined by the comparator 35 and then added to the error signature that was predicted by the controller 31, yielding the new Error Signature for the current cycle (GMS—(modulo 2) MISR).

This process is continued until the completion of the failing interval (which may be, for example, i+1023). After this, controller 31 continues to check comparator 35 every 1024 cycles except during other intervals where device is known to have failed. Once the diagnostic test is completed, the data that is stored in memory 32 is used by controller 31 to determine the cause and location of the fault in device 33.

Figure 5A:
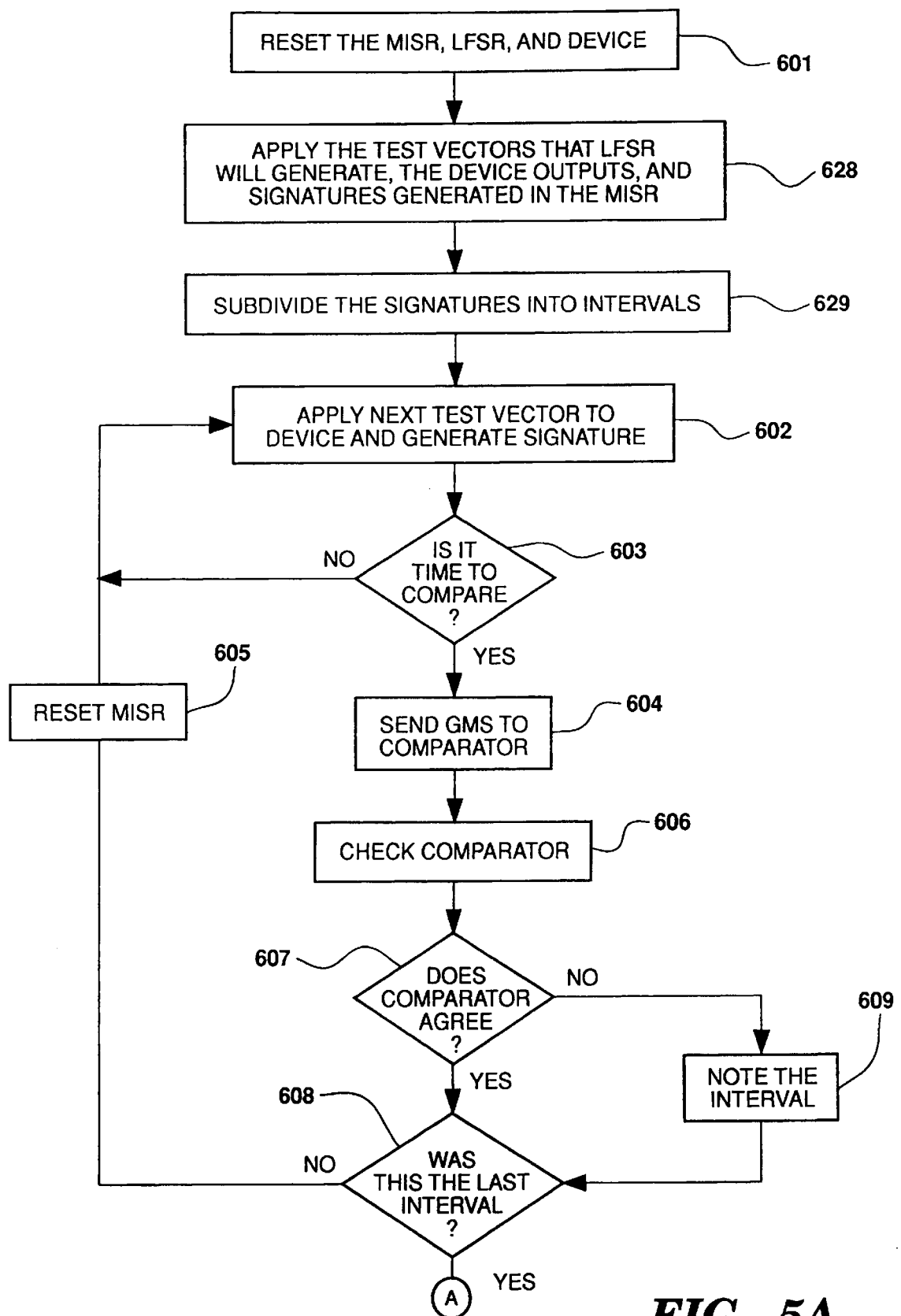
FIGS. 5A, 5B, 5C are detailed flow diagrams illustrating a method according to the present invention.
Figure 5B:
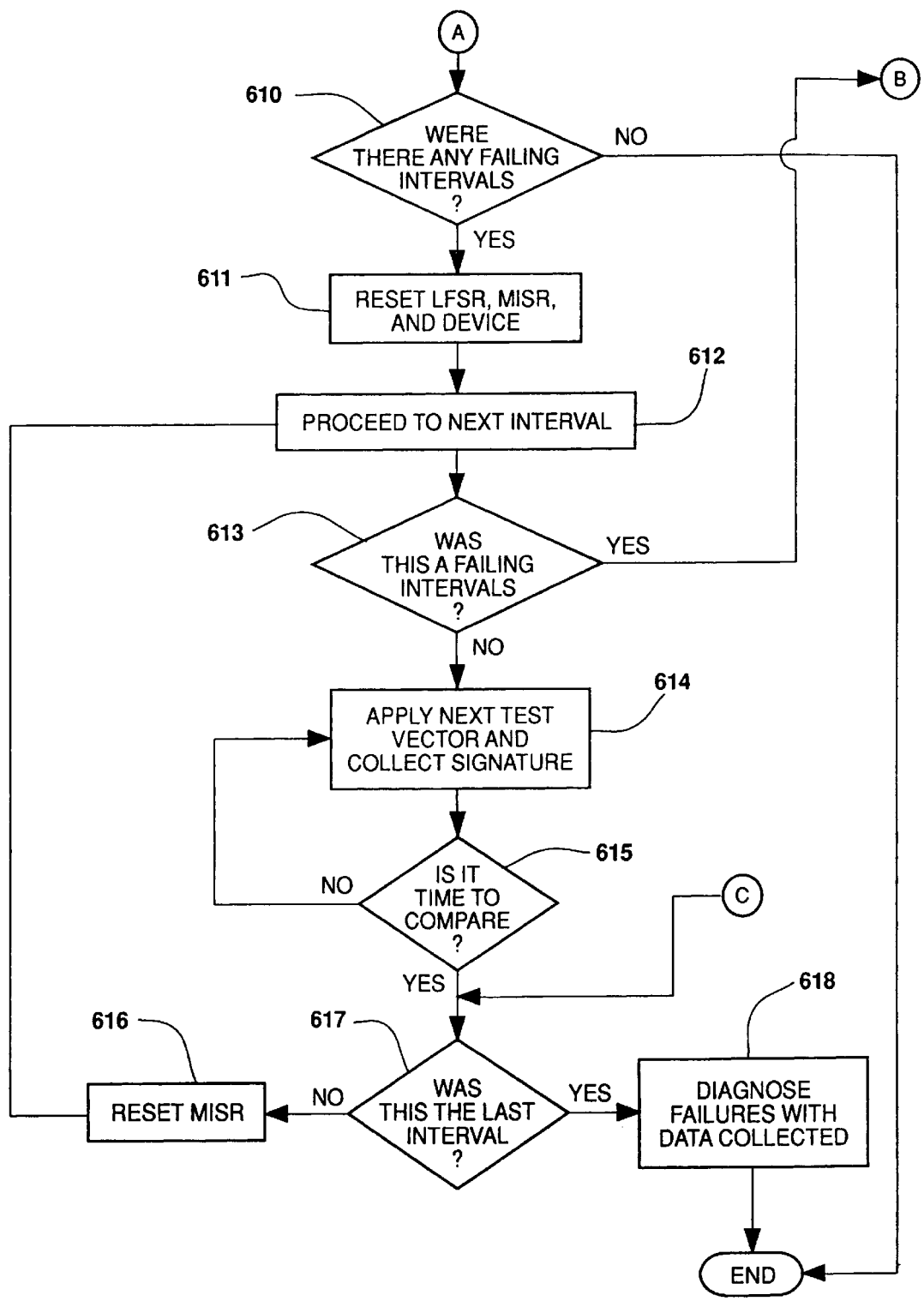
Figure 5C:
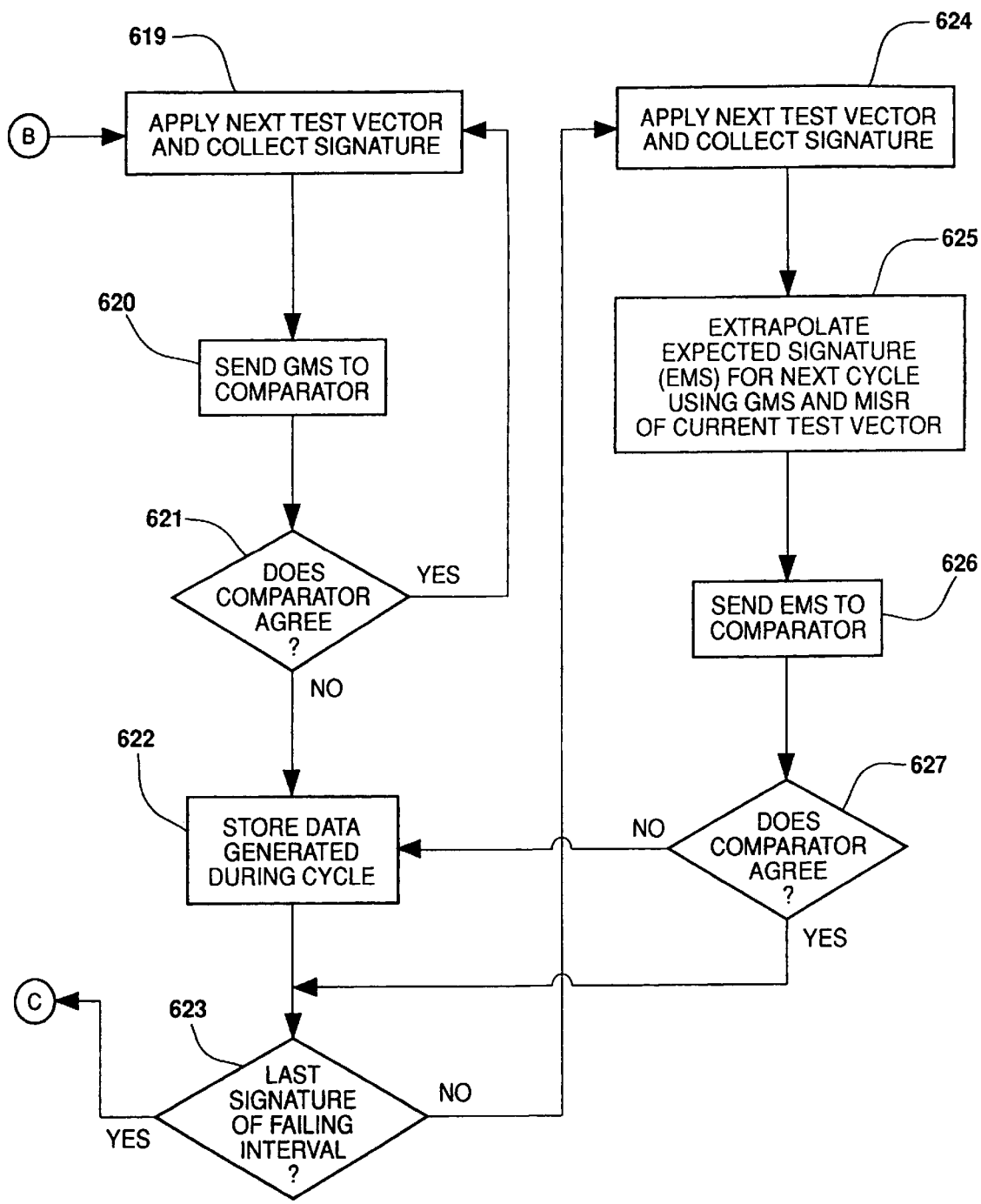

Referring now to FIG. 5 a flow diagram illustrating the operation of controller 31 will be described. In step 601, Controller 31 starts the test by resetting LFSR 12, MISR 14, and device 33. Once this is done, controller 31 simulates or retrieves the random test input patterns of LFSR 12 determining the sequence of test vectors that it will generate, the device outputs, and the signatures that will appear in MISR 14 in step 628. In step 629, controller 31 subdivides the test vectors and signatures into a set of intervals. In step 602, a test vector is applied to device 33 and collected in MISR 14. At the and of an interval, controller 31 sends the GMS to comparator 35 in step 604, and checks comparator 35 in step 606. If comparator 35 agrees, controller 31 will reset MISR 14 in step 605 and continue the next interval in step 602. If comparator 35 disagrees, the interval will be noted in step 609 and controller 31 will reset MISR 14 in step 605. This process is continued in step 608 until the last interval has been tested. When the last interval has been tested, this concludes the Go/Nogo Testing. Controller 31 checks if any failing intervals were noted during the Go/Nogo Test in step 610, and if there weren't any, device 33 has no faults and the test is concluded. If there were failing intervals, the Diagnostic Test is performed. LFSR 12, MISR 14, and device 33, are again reset by controller 31 in step 611. In step 612, controller 31 proceeds to the next interval, and checks to see if the interval was a failing interval during the Go/Nogo Test, in step 613. If it was note the controller 31 simply waits out the test. It continues the test in step 614, but when the interval is completed in step 615, there is no need to examine comparator 35. Controller 31 simply bypasses this, resets MISR 14 in step 616, and proceeds to the next interval in step 612 (unless this was the last interval in step 617).

If controller 31 determines that the interval was a failing interval, controller 31 must check comparator 35 after each test vector is applied. A test vector is applied to device 33 and MISR 14 collects the signature in step 619. After the signature is collected, controller 31 sends the GMS to comparator 35 in step 620. The controller 31 then checks comparator 35 in step 621. This process continues in steps 619–621 until comparator 35 disagrees in step 621. When comparator 35 disagrees, the first failing signature has been found. Controller 31 then stores the data in step 622. Unless if this was the last signature of the failing interval the next test vector is applied to the device 33 and MISR 14 collects the signature in step 624. Instead of sending the GMS to comparator 35, controller 31 extrapolates the expected signature (EMS) in step 625. After the EMS has been extrapolated in step 625, controller 31 sends the EMS to comparator 35 in step 626. The controller 31 then examines comparator 35 in step 627. Where comparator 35 agrees, the signature contains no new information that is useful to the diagnostic process and controller 31 proceeds to step 624 (unless if this was the last signature of the failing interval in step 623). If comparator 35 disagrees, data i s stored in step 622, and controller 31 proceeds to step 624 (unless if this was the last signature of the failing interval in step 623). This process is continued until the last signature of the failing interval once the last signature of the failing interval has been collected, controller 31 resets MISR 14 in step 616, and proceeds to the next interval in step 612.

The diagnostic testing is repeated for every interval in the test. When the last interval is completed in step 617, controller 31 uses the information stored in memory 32 to diagnose the cause of the failure(s) in device 33 in step 618, and the test is completed.

While the preferred embodiment calls for rerunning the entire test, an alternative embodiment can be implemented such that during the diagnostic test, only the failing intervals are retested. In order to perform this, controller 31 initializes LFSR 12 with the test vector that begins the failing interval. In another embodiment, controller 31 initializes LFSR 12 with the test vectors that begins the failing interval, immediately after it has been identified during the go/nogo testing.

It is also recognized that while the preferred embodiment calls for device 33 to be simulated and the GMS to be determined on-the-fly, the GMS can be determined pre-test and stored into a memory unit. Instead of simulating the GMS, controller 31 fetches the GMS from memory. Another alternative embodiment would be to use another device 33 known to be without defect (the "Reference Device" or "Golden Standard"). LFSR 12 would apply the same test vectors and instead of using controller 31 to determine the GMS, MISR 14 of the Gold Standard is the GMS. It is also recognized that the test vectors can be generated by controller 31 and inputted directly to device 33 without using a LFSR 12.

Figure 6:
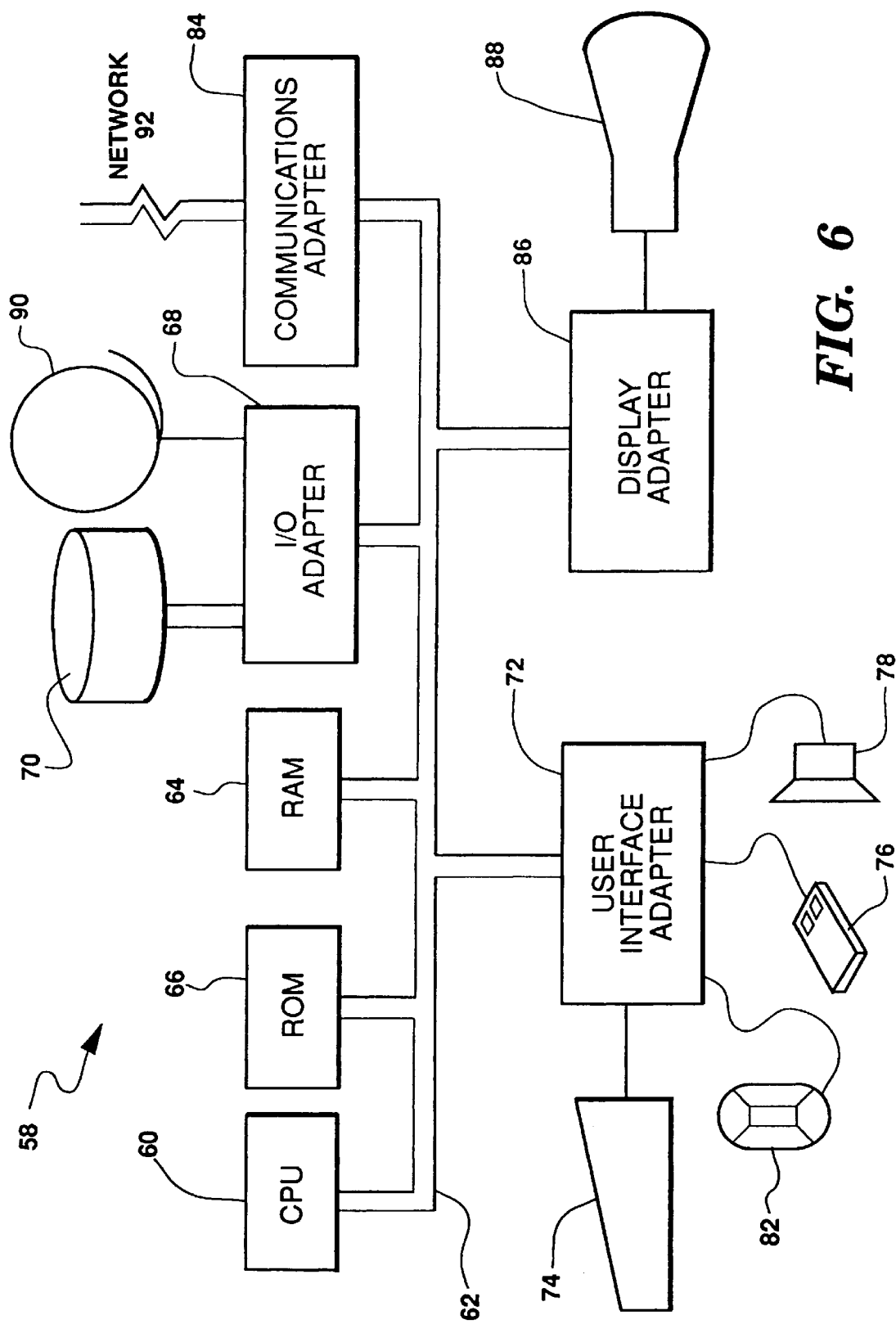
FIG. 6 illustrates an information handling system configurable for embodying the present invention.

Referring now to FIG. 6, a representative hardware environment for practicing the present invention is depicted and illustrates a typical hardware configuration of a computer information handling system 58 in accordance with the subject invention, having at least one central processing unit (CPU) 60. CPU 60 is interconnected via system bus 12 to random access memory (RAM) 64, read only memory (ROM) 66, and input/output (I/O) adapter 68 for connecting peripheral devices such as disc units 70 and tape drives 90 to bus 62, user interface adapter 72 for connecting keyboard 74, mouse 76 having button 67, speaker 78, microphone 82, and/or other user interfaced devices such as a touch screen device (not shown) to bus 62, communication adapter 84 for connecting the information handling system to a data processing network 92, and display adapter 86 for connecting bus 62 to display device 88.

Although the invention has been described with a certain degree of particularity, it should be recognized that elements thereof may be altered by persons skilled in the art without departing from the spirit and scope of the invention. One of the embodiments of the invention can be implemented as sets of instructions resident in the random access memory 64 of one or more computer systems configured generally as described in FIG. 6. Until required by the computer system, the set of instructions may be stored in another computer readable memory, for example in a hard disk drive, or in a removable memory such as an optical disk for eventual use in a CD-ROM drive or a floppy disk for eventual use in a floppy disk drive. Further, the set of instructions can be stored in the memory of another computer and transmitted over a local area network or a wide area network, such as the Internet, when desired by the user. One skilled in the art would appreciate that the physical storage of the sets of instructions physically changes the medium upon which it is stored electrically, magnetically, or chemically so that the medium carries computer readable information. The invention is limited only by the following claims and their equivalents.

What is claimed is:

1. A method for diagnosing failures in a device comprising the steps of:

applying a sequence of test inputs to the device;

collecting actual signatures corresponding to the sequence of test inputs;

dividing the actual signatures into one or more intervals;

finding a failing interval from the intervals;

finding a failing signature in the failing interval; and deriving an expected signature from the failing signature.

2. The method of claim 1 wherein said step of deriving an expected signature further comprises the steps of:

deriving an error signature from said failing signature; and deriving a second error signature from the error signature.

3. The method of claim 2 wherein said step of deriving an expected signature further comprises the steps of:

obtaining a good machine signature; and modulo-2 adding the second error signature to said good machine signature to derive the expected signature.

4. The method of claim 1, wherein said step of deriving an expected signature further comprises the steps of:

obtaining a good machine signature;

modulo-2 adding an error signature derived from said failing signature to said good machine signature to derive the expected signature.

5. The method of claim 1, further comprising the steps of:

comparing the expected signature to one of the actual signatures.

6. The method of claim 5, wherein if the expected signature and the actual signature are not identical as determined from said comparing step, then recording the actual signature or test inputs corresponding to the actual signature.

7. The method of claim 6, further comprising the steps of:

a) repeating said step of finding a failing signature in the failing interval;

b) repeating said step of deriving an expected signature;

c) repeating said step of comparing the expected signature to one of the actual signatures;

d) repeating said step of wherein if the expected signature and the actual signature are not identical as determined from said comparing step then recording the actual signature or test inputs corresponding to the actual signature; and e) repeating steps a)–d) for each actual signature in the failing interval.

8. The method of claim 7, further comprising the step of: repeating step e) for each failing interval.

9. A system for diagnosing failures in a device comprising:

means for applying a sequence of test inputs to the device;

means for collecting actual signatures corresponding to the sequence of test inputs;

means for dividing the actual signatures into one or more intervals;

means for finding a failing interval from the intervals;

means for finding a failing signature in the failing interval; and means for deriving an expected signature from the failing signature.

10. The system of claim 9 wherein said means for deriving an expected signature further comprises:

means for deriving an error signature from said failing signature; and means for deriving a second error signature from the error signature.

11. The system of claim 10 wherein s aid means for deriving an expected signature further comprises:

means for obtaining a good machine signature; and means for modulo-2 adding the second error signature to said good machine signature to derive the expected signature.

12. The system of claim 9, wherein said means for deriving an expected signature further comprises:

means for obtaining a good machine signature;

means for modulo-2 adding an error signature derived from said failing signature to said good machine signature to derive the expected signature.

13. The system of claim 9, further comprising:

means for comparing the expected signature to one of the actual signatures.

14. The system of claim 13, further comprising:

means for recording the actual signature or test inputs corresponding to the actual signature if the expected signature and the actual signature are not identical.

15. An information handling system for diagnosing faults in a device comprising:

one or more processors;

memory;

a bus for coupling said processor to said memory;

means for applying a sequence of test inputs to the device;

means for collecting actual signatures corresponding to the sequence of test inputs;

means for dividing the actual signatures into one or more intervals;

means for finding a failing interval from the intervals;

means for finding a failing signature in the failing interval; and means for deriving an expected signature from the failing signature.

16. The information handling system of claim 15 wherein said means for deriving an expected signature further comprises means for deriving an error signature from said failing signature; and means for deriving a second error signature from the error signature.

17. The information handling system of claim 16 wherein said means for deriving an expected signature further comprises:

means for obtaining a good machine signature; and means for modulo-2 adding the second error signature to said good machine signature to derive the expected signature.

18. The information handling system of claim 15, wherein said means for deriving an expected signature further comprises:

means for obtaining a good machine signature;

means for modulo-2 adding an error signature derived from said failing signature to said good machine signature to derive the expected signature.

19. The information handling system of claim 15, further comprising:

means for comparing the expected signature to one of the actual signatures.

20. The information handling system of claim 15, further comprising:

means for recording the actual signature or test inputs corresponding to the actual signature where the actual signature does not agree with the expected signature.

21. A computer readable medium comprising:

means for applying a sequence of test inputs to the device;

means for collecting actual signatures corresponding to the sequence of test inputs;

means for dividing the actual signatures into one or more intervals;

means for finding a failing interval from the intervals;

means for finding a failing signature in the failing interval; and means for deriving an expected signature from the failing signature.

22. The computer readable medium of claim 21 wherein said means for deriving an expected signature further comprises:

means for deriving an error signature from said failing signature; and means for deriving a second error signature from the error signature.

23. The computer readable medium of claim 22 wherein said means for deriving an expected signature further comprises:

means for obtaining a good machine signature; and means for modulo-2 adding the second error signature to said good machine signature to derive the expected signature.

24. The computer readable medium of claim 21, wherein said means for deriving an expected signature further comprises:

means for obtaining a good machine signature;

means for modulo-2 adding an error signature derived from said failing signature to said good machine signature to derive the expected signature.

25. The computer readable medium of claim 21, further comprising:

means for comparing the expected signature to one of the actual signatures.

26. The computer readable medium of claim 25, further comprising:

means for recording the actual signature or test inputs corresponding to the actual signature if the expected signature and the actual signature are not identical.

* * * * *